United States Patent
Välimäki et al.

[19]

[11] Patent Number: 5,812,608
[45] Date of Patent: Sep. 22, 1998

[54] METHOD AND CIRCUIT ARRANGEMENT FOR PROCESSING RECEIVED SIGNAL

[75] Inventors: Vesa Välimäki, Helsinki; Jukka Henriksson, Espoo; Timo Laakso, Helsinki, all of Finland

[73] Assignee: Nokia Technology GmbH, Pforzheim, Germany

[21] Appl. No.: 642,339

[22] Filed: May 3, 1996

[30] Foreign Application Priority Data

May 5, 1995 [FI] Finland .................................... 952186

[51] Int. Cl.⁶ ...................................................... G06F 17/17
[52] U.S. Cl. ........................ 375/331; 375/349; 375/350; 364/724.012; 364/724.1; 364/724.16; 364/724.19; 348/538; 348/555
[58] Field of Search ...................................... 375/229, 232, 375/234, 235, 324, 328, 340, 343, 344, 346, 349, 350, 355; 364/577, 715.03, 723, 724.01, 724.1, 724.16, 724.19, 724.012; 341/50, 61; 348/441, 443, 445, 538, 555, 556, 572; 386/34; 360/32; 327/553, 115; 358/428, 445

[56] References Cited

U.S. PATENT DOCUMENTS

| | | | |
|---|---|---|---|
| 4,866,647 | 9/1989 | Farrow | 364/724.1 |
| 5,500,874 | 3/1996 | Terrell | 375/232 |
| 5,504,785 | 4/1996 | Becker et al. | 375/344 |
| 5,530,406 | 6/1996 | Fernandez Duran et al. | 331/12 |
| 5,612,975 | 3/1997 | Becker et al. | 375/319 |
| 5,621,404 | 4/1997 | Heiss et al. | 341/61 |

FOREIGN PATENT DOCUMENTS

| | | |
|---|---|---|
| 0649233 | 4/1995 | European Pat. Off. . |
| 9428657 | 12/1994 | WIPO . |

*Primary Examiner*—Amanda Le
*Attorney, Agent, or Firm*—Ware, Fressola, Van Der Sluys & Adolphson LLP

[57] ABSTRACT

The invention is related to a method and circuit arrangement for processing a received signal in a variable symbol rate system, such as a digital television system. In the method and arrangement according to the system, a received signal is sampled at a fixed sampling frequency ($f_f$) that is higher than the symbol frequency of any one of the received signals. The resulting sample sequence is converted to another sample sequence the sampling frequency of which equals the symbol frequency ($f_i$) of the received signal or its integer multiple. Then the samples are filtered (8) and signal value decisions are made (9) for the filtered samples. Conversion of the sampling frequency is advantageously performed using a so-called modified Farrow-type fractional delay filter (6) which is controlled using a control signal proportional to the delay of each sample. Using the method and arrangement according to the invention it is possible to process received signals the symbol frequencies of which are arbitrary within set limits.

11 Claims, 2 Drawing Sheets

METHOD AND CIRCUIT ARRANGEMENT FOR PROCESSING RECEIVED SIGNAL

TECHNICAL FIELD

The invention relates to a method and a circuit arrangement for processing a received signal in a variable symbol frequency system, such as a digital television system.

BACKGROUND OF THE INVENTION

In digital transmission systems there is a tendency to introduce transmission methods which make use of quadrature multi-state modulation and in which the symbol, or transmission, rate is variable. The symbol rate may be channel-specific or it may vary within a transmission channel. A typical symbol rate can be from 1 to 30 MBd. In a variable symbol rate system, the task of a receiver is to recognize the symbol rate used and perform reception in an optimal manner with respect to the symbol rate in question. Digital transmission is discussed e.g. in [1] The European Digital Video Broadcasting Project (DVB) 1994 DVB-TCM 11, version 3, DVB Project Office c/o EBU, 1994.

It is known to process a received signal using digital sampling of a baseband signal on a fixed clock frequency, whereby the sampled data are filtered and a decision on the signal value is made on the basis of the filtered samples. In the digital filtering of samples it is used the same clock frequency as in the sampling.

This principle can be applied in a variable symbol frequency system by changing the sampling frequency to correspond to the symbol frequency used. As the symbol frequency is initially unknown, it is detected from the filtered samples and then the sampling frequency and filter clock frequency are altered to correspond to the detected symbol frequency. It is known to detect the symbol frequency using e.g. zero crossing monitoring, nonlinear operation +filtering or a so-called early-late circuit.

Considerable accuracy and stability are required of a sampling frequency. In fixed symbol frequency systems, the sampling frequency is generated by dividing the frequency of a suitably selected crystal oscillator by an integer. Then the sampling frequency generated digitally from the crystal oscillator meets the requirements.

If, in a variable symbol frequency system, only specified symbol frequencies are used wherein the frequency ratio is a rational number, the necessary sampling frequencies can be formed by dividing a sufficiently high crystal oscillator frequency by variable integers.

However, the ratio of the symbol frequencies used in a variable symbol frequency system is not necessarily a fraction consisting of small integers, but e.g. to maximize the transmission efficiency it is advantageous to allow the symbol frequency to be freely selected within set limits. Then the correct sampling frequency is not necessarily obtained by dividing the frequency of the crystal oscillator in use, but one should use e.g. an analog oscillator based on a phase-locked loop. In this way, it is very difficult to achieve sufficient accuracy and stability for the sampling frequency. Furthermore, the use of analog technology in conjunction with blocks otherwise implemented with digital technology results in manufacturing problems and extra costs.

DISCLOSURE OF INVENTION

The object of the invention is to provide a method and a circuit arrangement for processing a received signal in a system having a variable symbol frequency, avoiding aforementioned disadvantages associated with the prior art.

The essential idea of the invention is that a received baseband signal is digitally sampled at a sampling frequency which is higher than the maximum symbol frequency of the received signals and then the sampling frequency is converted prior to filtering and decision-making so that it equals said symbol frequency or its integer multiple. The sampling frequency conversion is advantageously performed with a so-called modified Farrow-type fractional delay filter which is controlled with a control signal proportional to the delay of each sample.

The advantage of the solution according to the invention is that the ratio of the symbol frequency of the received signal and the sampling frequency of the receiver can be arbitrary within set limits. In addition, the solution can be implemented using digital technology, simple structure and low computation capacity.

The method according to the invention is characterized in that the sampling is performed at a frequency which is higher than the maximum symbol frequency of the received signal, thus generating a first sample sequence which prior to the filtering is used to generate a second sample sequence the sampling frequency of which substantially equals the symbol frequency of the received signal or its integer multiple. The circuit arrangement according to the invention is characterized in that the sampling frequency of the sampling circuit is higher than the symbol frequency of the received signal, and the circuit arrangement includes a fractional delay filter to convert the sampling frequency of the sampled signal so that it substantially equals the symbol frequency of the received signal or its integer multiple.

These and other objects, features and advantages of the present invention will become more apparent in light of the detailed description of a best mode embodiment thereof, as illustrated in the accompanying drawing.

BEST MODE FOR CARRYING OUT THE INVENTION

The following block numbers are used in the figures:

| | |
|---|---|
| 1 Bandpass filter | 11 FIR filter |
| 2 Mixer | 12 Multiplier |
| 3 Voltage-controlled oscillator | 13 Adder |
| 4 Low-pass filter | 14 Adder |
| 5 A/D converter | 15 Shift register |
| 6 Fractional delay filter | 16 Adder |
| 7 Sampling frequency converter | 17 Constant multiplier |
| 8 Signal filter | 18 Controllable multiplier |
| 9 Decision circuit | |
| 10 Timing block | |

Figure 1:
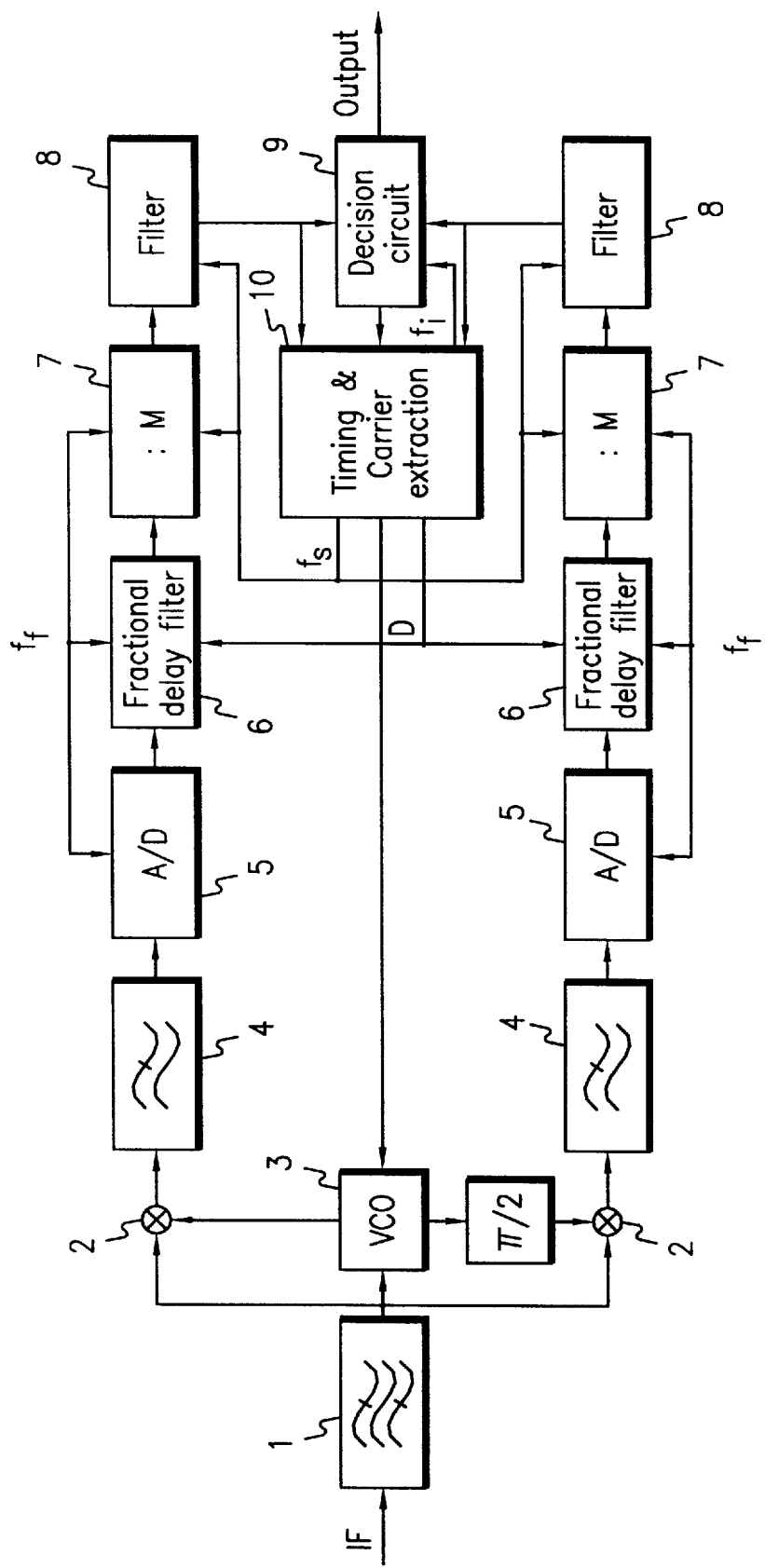
FIG. 1 is a block diagram of the baseband part of a receiver according to the invention.

FIG. 1 is a block diagram illustrating the baseband signal processing in a receiver according to the invention in a transmission system employing the QPSK (quadrature phase shift keying) method. In the high-frequency part (not shown) of the receiver, the received signal is amplified and mixed to the intermediate frequency (IF). The IF signal is a band-limited bandpass signal the center frequency of which can be selected by the manufacturer of the receiver (say, 70 MHz).

The QPSK symbol rate, which is not known to the receiver in advance, can be selected e.g. between 1 and 30 MBd.

The IF signal is filtered by a bandpass filter 1 and taken to mixers 2, in which the signal is demodulated to the baseband frequency. A voltage-controlled oscillator 3 (VCO) feeds to the mixers 2 of the in-phase (I) and quadrature (Q) branches the in-phase and phase-shifted mixing frequencies, respectively, thereby resulting in an in-phase (I) and quadrature (Q) baseband signal component. The sidebands that are generated as mixing results are eliminated by a loose analog low-pass filter 4, which has no effect on the contents of the low-pass-type signal.

The low-pass signals are converted into digital ones in an A/D converter 5, in which the sample resolution is about 5 to 6 bits in a digital television application. The sampling frequency of the A/D converter in this solution according to the invention is a fixed frequency $f_f$. Theoretically, the sampling frequency has to be at least as high as the symbol frequency $f_i$ but in order to achieve sufficient accuracy the sampling frequency should be at least twice the symbol frequency $f_i$. In a digital television system, where the maximum symbol frequency is 30 MBd, the system clock frequency $f_f$ should then be at least 60 MHz.

The signal is filtered with digital raised-cosine half Nyquist filters 8 in order to reduce sample interaction. In digital TV applications, the value of the so-called α parameter is determined as 0.35. This filter must adapt to the symbol rate used, i.e. the filter clock frequency $f_s$ should equal the symbol frequency of the received signal or its integer multiple.

A decision for the signal value is made in a decision circuit 9 on the basis of the filtered samples. The decision can be made using a known method, e.g. by quantizing or by calculating minimum distances. The decisions are made at the symbol frequency $f_i$.

The symbol frequency of the received signal is detected in a timing block 10. When the symbol frequency has been detected, the filter clock frequency $f_s$ is generated in the timing block. The symbol clock can be generated using e.g. the aforementioned methods: zero crossing monitoring, non-linear operation+filtering or a so-called early-late circuit. A clock frequency at the symbol frequency $f_i$ for the decision circuit is generated in the timing block.

The timing block 10 also performs the carrier frequency and phase extraction and controls the voltage-controlled oscillator 3 used in the demodulation. This can be implemented using a COSTAS loop or a decision-controlled loop. A decision-controlled loop requires that the decisions made in the decision circuit be also directed to the timing block 10, whereas a COSTAS loop uses only samples obtained from the filters 8.

The operation of the Nyquist filter and the decision circuit and symbol frequency detection and carrier wave extraction are described e.g. in [2] Proakis, J. G., Digital communications (1989) McGraw-Hill, Inc., New York, 905 pp.

In the solution according to the invention, digital samples obtained at a fixed sampling frequency $f_f$ from an A/D converter are first converted to a lower sampling frequency by means of a fractional delay filter 6 prior to filter 8. The fractional delay filter decreases the sampling frequency by a factor of 1 to 2 by interpolating new sample values at required moments of time. The fractional delay filter is controlled in a manner such that the sampling frequency of the resulting sample sequence equals the symbol frequency $f_i$ of the received signal or its integer multiple.

In addition, the circuit may include after the fractional delay filter 6, prior to filter 8, a sampling frequency converter 7 which, when necessary, divides the sampling frequency obtained from the fractional delay filter 6 by a small integer M, which is advantageously 1, 2, 3 or 4. Thus, a sample sequence is obtained for filter 8 with a sampling frequency that equals the symbol frequency $f_i$ of the received signal or its integer multiple, independent of the ratio of the A/D converter clock frequency $f_f$ and symbol frequency $f_i$.

An essential constituent in the solution according to the invention is the fractional delay filter with which it is possible to interpolate the samples at arbitrary moments of time. Next, we will describe a fractional delay filter structure with which it is possible to advantageously implement a receiver solution according to the invention in a variable symbol rate system. In addition, we will disclose a theoretical basis for the operation of said filter structure.

An individual output signal sample y(n) approximates an ideally delayed signal $y_{id}(n)=x(n-D)$. Variable D is a real-value delay parameter and its fractional part d is called the fractional delay. The signal sample y(n) can be represented as follows:

$$y(n) = x(n)*h(n) = \sum_{k=0}^{\infty} h(k)x(n-k), \qquad (1)$$

where x(n) is the input signal and h(n) is the impulse response of the interpolating filter.

For signal y(n) to correspond to the ideally delayed signal, the impulse response h(n) should be of infinite length, which is not possible in practical solutions. A known method for designing a finite-length, so-called FIR (finite impulse response) type fractional delay filter is Lagrange interpolation, which is a maximally-flat approximation to ideal interpolation.

The coefficients of a Lagrange interpolator can be presented in closed form:

$$h(n) = \prod_{\substack{k=0 \\ k=n}}^{N} \frac{D-k}{n-k}, \text{ where } n = 0, 1, 2, \ldots N \qquad (2)$$

where N is the order of the filter.

Such a method is disclosed e.g. in [3] Laakso, T., V älimäki, V., Karjalainen, M., & Laine, U.K. 1994. Crushing the Delay-Tools for Fractional Delay Filter Design. Report no. 35, Helsinki University of Technology, Laboratory of Acoustics and Audio Signal Processing, Espoo, Finland, 46 pp.

Next, we will model a structure for a Lagrange interpolator that can be efficiently implemented in a time-varying application. Our aim is that the coefficients of the FIR filter are presented as Nth-degree polynomials of the delay parameter D, whereby the filter can be realized by means of a FIR filter with N+1 constant coefficients and the delay can be adjusted by only changing parameter D. Such a form of Lagrange interpolation can be derived as follows:

Let us first form a filter approximation on the z plane:

$$Y(z)=H(z)X(z) \qquad (3)$$

where X(z) and Y(z) are the z transforms of the filter input and output signals x(n) and y(n) and the transfer function H(z) of the interpolation filter is now given as a polynomial of D:

$$H(z) = \sum_{k=0}^{N} C_k(z)D^k \qquad (4)$$

In proving Lagrange interpolation it is required that the polynomial gets the same value as data x(n) at integer points n=0, 1, 2, ..., N. The same requirement can be presented on the z plane as follows:

$$Y(z) = z^{-D} X(z) \text{ when } D = 0, 1, 2, \ldots, N \quad (5)$$

With equations (3) and (4) we can derive N+1 conditions:

$$\sum_{k=0}^{N} C_k(z) D^k = z^{-D} \text{ when } D = 0, 1, 2, \ldots, N \quad (6)$$

which can be written in matrix form:

$$Uc = z \quad (7)$$

where L×L matrix U is $$U = \begin{bmatrix} 0^0 & 0^1 & 0^2 & \ldots & 0^N \\ 1^0 & 1^1 & 1^2 & & 1^N \\ 2^0 & 2^1 & 2^2 & & 2^N \\ \cdot & & \cdot & & \cdot \\ \cdot & & & \cdot & \cdot \\ \cdot & & & & \cdot \\ N^0 & N^1 & N^2 & \ldots & N^N \end{bmatrix} = \begin{bmatrix} 1 & 0 & 0 & \ldots & 0 \\ 1 & 1 & 1 & & 1 \\ 1 & 2 & 4 & & 2^N \\ \cdot & & \cdot & & \cdot \\ \cdot & & & \cdot & \cdot \\ \cdot & & & & \cdot \\ 1 & N & N^2 & \ldots & N^N \end{bmatrix}, \quad (8)$$

vector c:

$$c = [C_0(z) C_1(z) C_2(z) C_N(z)]^T \quad (9)$$

and delay vector z:

$$z = [1 z^{-1} z^{-2} \ldots z^{-N}]^T \quad (10)$$

U is a so-called Vandermonde matrix and hence there is an inverse matrix $U^{-1}$ by means of which the solution for equation (7) can be given by $$c = U^{-1} z \quad (11)$$

Hereinafter, the inverse matrix $U^{-1}$ will be marked Q. The rows of the inverse Vandermonde matrix Q contain the coefficients of the new filter structure and therefore the matrix is presented as follows:

$$Q = [q_0 \, q_1 q_2 \ldots q_N]^T \quad (12)$$

The transfer functions $C_n(z)$ are obtained as scalar products $$C_n(z) = q_n z = \sum_{k=0}^{N} q_n(k) z^{-k}, \text{ where } n = 1, 2, \ldots, N \quad (13)$$

By substituting D=0 in equation (13) we can see that $$\sum_{k=0}^{N} C_k(z) 0^k = 1 \Rightarrow C_0(z) = 1 \quad (14)$$

i.e. that transfer function $C_0(z)=1$, independent of the filter order N. The other transfer functions $C_n(z)$ are Nth-degree polynomials of z, ie. Nth-order FIR filters.

This derived structure can be called the Farrow structure of the Lagrange interpolator. The Farrow structure has been earlier disclosed in other connections e.g. in

[4] Farrow, C. W. 1988. A continuously variable digital delay element. Proc. 1988 IEEE Int. Symp. On Circuits and Systems (ISCAS '88), Espoo, Finland, Jun. 7–9, 1988, vol 3, pp. 2641 to 2645.

[5] Välimäki, V. 1994. Fractional Delay Waveguide Modeling of Acoustic Tubes. Report no. 34, Helsinki University of Technology, Laboratory of Acoustics and Audio Signal Processing, Espoo, Finland, 133 pp.

The Farrow structure can be efficiently implemented with Horner's method, which is an efficient method for evaluating a polynomial:

$$\sum_{k=0}^{N} C_k(z) D^k = C_0(z) + [C_1(z) + \overbrace{[C_2(z) + \ldots + [C_{N-1}(z) + C_N(z) D]D]D \ldots ]D}^{N} \quad (15)$$

Figure 2:
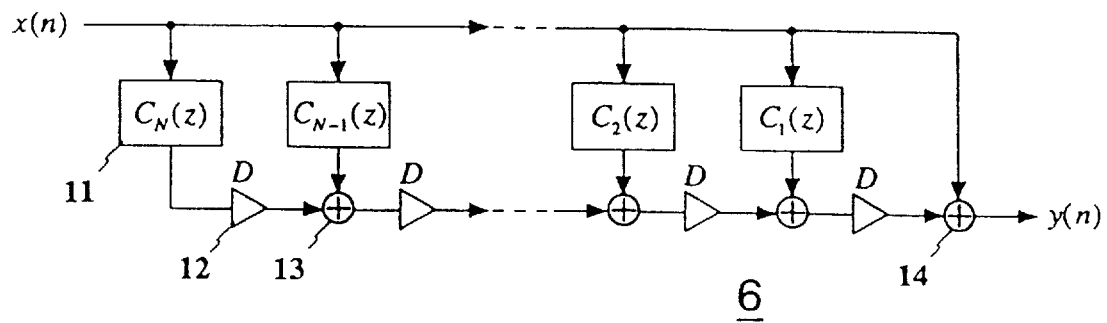
FIG. 2 illustrates the Farrow structure of a Lagrange interpolator.

In this form, the implementation of the filter structure requires N multiplications by D. The implementation according to formula (15) of this "direct-form" Nth-order Lagrange interpolator is illustrated in FIG. 2. The advantageous characteristic of this structure is that the transfer functions $C_n(z)$ 11 are constant with a certain value of N. Thus, the interpolator is adjusted directly as a fractional delay value D in multipliers 12, which means that calculation for other parameters is not needed when the value of the delay is changed.

The Farrow structure can be converted into a more efficient form by changing the integer part of parameter D. This means moving the unit delays from a location to another inside the system, whereby the transfer function of the system remains unchanged. The new parameter d gets values 0<d<1(N odd) or −0.5<d<0.5(N even). This change can be performed using a conversion matrix T, which is defined as follows:

$$T_{n,m} = \begin{cases} \text{round}\left(\dfrac{N}{2}\right)^{n-m} \binom{n}{m} & \text{when } n \geq m \\ 0 & \text{when } n < m \end{cases} \quad (16)$$

where n,m=0, 1, 2, ..., N.

Let us next discuss a special case of the new structure with N=3. Then the conversion matrix is as follows:

$$T = \begin{bmatrix} 1 & 1 & 1 & 1 \\ 0 & 1 & 2 & 3 \\ 0 & 0 & 1 & 3 \\ 0 & 0 & 0 & 1 \end{bmatrix} \quad (17)$$

When the coefficient matrix Q of the third-order filter structure is multiplied by this matrix we get:

$$\ddot{O} = TQ = \begin{bmatrix} 0 & 1 & 0 & 0 \\ -1/3 & -1/2 & 1 & -1/6 \\ 1/2 & -1 & 1/2 & 0 \\ -1/6 & 1/2 & -1/2 & 1/6 \end{bmatrix} \quad (18)$$

Figure 3:
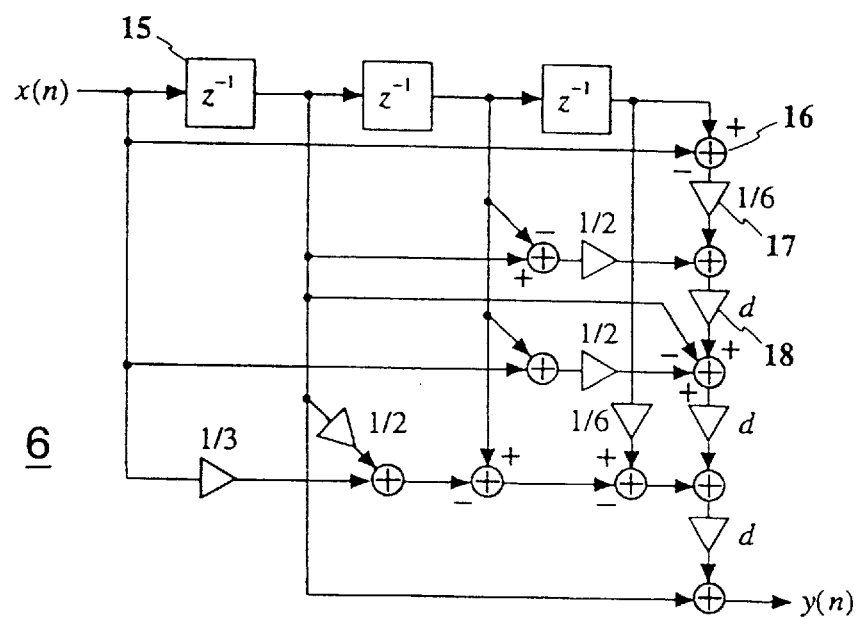
FIG. 3 illustrates a modified Farrow structure of a 3rd-order Lagrange interpolator.

This filter implementation is shown in FIG. 3. The structure of the figure contains 10 additions that are implemented with adders 16. One of the adders has three inputs, and therefore the calculation may in practice be more advantageous to implement with two 2-input adders. Then, 11 adders are required. In addition, the structure contains 9 multipliers, and in six multipliers 17 the multiplier is a constant and in three multipliers 18 the multiplier is a delay parameter d. Constant-coefficient transfer functions can use common shift registers 15. An Nth-order Farrow filter requires only N shift registers to realize a delay line, like one Nth-order direct-form FIR filter.

If a Lagrange interpolator were realized as a direct-form FIR filter, we would first need 3 additions and 10 multiplications to determine the filter coefficients and another 3 additions and 4 multiplications to calculate the output sample, i.e. in total 6 additions and 14 multiplications. All in all, we need 20 calculations as in the Farrow structure, but in the direct-form implementation the proportion of the multiplications would be higher than in the Farrow structure. Furthermore, in the direct-form implementation, practical calculation of coefficients requires storing of intermediate results and, hence, more memory.

As regards a conventional digital television application, the third-order filter discussed above can achieve a sufficient sample value accuracy. The order may also be some other small odd integer, such as 5 or 7. In the circuit arrangement according to the invention there is thus no need for high-order filters and the need for shift registers is also low. In addition, we can simply and swiftly calculate accurate values for the filter coefficients. The implementation requires only a small amount of multiplications per output sample.

The method can be efficiently implemented with a programmable signal processor or a special circuit, which can be designed for this purpose. In digital television technology the sampling frequency is very high and therefore the special circuit implementation is an advantageous solution for this purpose. In applications using a lower sampling frequency, such as modem or audio signal applications, the signal processor is an advantageous implementation solution.

Even though the signal processed in the system described above is a baseband one, it is also possible, within the scope of the inventive idea, to realize a receiver in which the sampling frequency conversion is performed for a signal which has not been demodulated to the baseband frequency.

Above it was discussed some applications of the method according to the invention. Naturally, the principle according to the invention can be varied within the scope of the invention, e.g. with respect to details of implementation and fields of use. The invention is therefore not limited to a digital television system but can be applied in other digital transmission systems as well.

We claim:

1. A method for processing a received signal in a variable symbol rate system, comprising the steps of:

digitally sampling the received signal at a fixed frequency ($f_f$) which is higher than a maximum symbol frequency of the received signal, and filtering a thus obtained first sample sequence of the received signal using a Lagrange interpolation to form a second sample sequence at a sampling frequency which substantially equals a symbol frequency ($f_s$) of the received signal or an integer multiple thereof wherein the Lagrange interpolation is performed substantially according to a Farrow structure.

2. The method of claim 1, wherein an order of the Lagrange interpolation is a small odd integer.

3. The method of claim 1, wherein each sample of the second sample sequence has an associated real-value delay parameter (D).

4. The method of claim 1, further comprising the step of using the second sample sequence to form a third sample sequence having a sampling frequency which substantially equals the sampling frequency of the second sample sequence divided by an integer (M).

5. The method of claim 1, further comprising the step of converting the fixed frequency ($f_f$) of the first sample sequence so that the sampling frequency of the second sample sequence provided by the step of filtering equals the symbol frequency of the received signal or an integer multiple thereof.

6. The method of claim 1, further comprising the step of modulating the received signal using a quadrature method, whereby the first sample sequence is converted separately for the first sample sequences of a separate in-phase branch and quadrature branch.

7. A circuit arrangement for processing a received signal in a variable symbol rate system, including, connected in succession, a sampling circuit (5) for producing digital samples, a filter (8) and a decision circuit (9) for generating a decision value for the digital samples, characterized in that a sampling frequency ($f_f$) of the sampling circuit (5) is higher than a maximum symbol frequency of the received signal, and the circuit arrangement includes a fractional delay filter (6) which is a Lagrange interpolator for providing a converted sampling frequency which substantially equals a symbol frequency of the received signal or an integer multiple thereof.

8. The circuit arrangement of claim 7, characterized in that after the fractional delay filter (6), prior to the decision circuit (9), the circuit arrangement contains a sampling frequency converter (7) for dividing the converted sampling frequency by an integer (M).

9. The circuit arrangement of claim 7, characterized in that said Lagrange interpolator is of a Farrow structure, whereby a control signal is substantially proportional to a sample delay (D).

10. The circuit arrangement of claim 9, characterized in that said Lagrange interpolator is of a modified Farrow structure, wherein a number of shift registers and a number of multipliers used in said Farrow structure are minimized.

11. The circuit arrangement of claim 7, characterized in that an order of the Lagrange interpolator is a small odd integer.

* * * * *